United States Patent
Sellin

(10) Patent No.: US 9,766,281 B2
(45) Date of Patent: Sep. 19, 2017

(54) METHOD FOR MONITORING AN ELECTRICAL POWER SUPPLY LINE COMPRISED IN A SEISMIC CABLE, CORRESPONDING SYSTEM, COMPUTER PROGRAM PRODUCT AND NON-TRANSITORY COMPUTER-READABLE CARRIER MEDIUM

(71) Applicant: Sercel, Carquefou (FR)

(72) Inventor: Isabelle Sellin, Vigneux de Bretagne (FR)

(73) Assignee: SERCEL, Carquefou (FR)

( * ) Notice: Subject to any disclaimer, the term of this patent is extended or adjusted under 35 U.S.C. 154(b) by 391 days.

(21) Appl. No.: 14/629,035

(22) Filed: Feb. 23, 2015

(65) Prior Publication Data

US 2015/0241497 A1 Aug. 27, 2015

(30) Foreign Application Priority Data

Feb. 21, 2014 (EP) .................................... 14305240

(51) Int. Cl.
*G01R 31/02* (2006.01)
*G01R 15/24* (2006.01)
(Continued)

(52) U.S. Cl.
CPC ......... *G01R 31/021* (2013.01); *G01M 11/083* (2013.01); *G01R 15/24* (2013.01);
(Continued)

(58) Field of Classification Search
CPC .... G01R 15/24; G01R 31/083; G01R 31/021; G01V 1/18; G01V 1/201; G01V 1/38; G01M 11/083
See application file for complete search history.

(56) References Cited

U.S. PATENT DOCUMENTS 5,303,202 A 4/1994 Carroll et al.
6,268,911 B1 * 7/2001 Tubel ...................... E21B 23/03
250/256
(Continued)

FOREIGN PATENT DOCUMENTS

CA 2881346 A1 * 8/2015 ............. G01R 15/24
CN 104865612 A * 8/2015 ............. G01R 15/24
(Continued)

OTHER PUBLICATIONS

European Search Report dated Jul. 24, 2014 for the corresponding European Application No. EP 14305240 filed Feb. 21, 2014.
(Continued)

*Primary Examiner* — Daniel Pihulic
(74) *Attorney, Agent, or Firm* — Ipsilon USA, LLP

(57) ABSTRACT

It is proposed a method for monitoring an electrical power supply line comprised in a seismic cable and extending along the seismic cable. The seismic cable includes: a plurality of seismic sensors arranged along the seismic cable, a plurality of controllers arranged along the seismic cable, and an optical transmission line extending along the seismic cable for carrying data signals from or towards the controllers. The electrical power supply line supplies at least one pair of master and slave controllers. The master controller of a given pair of master and slave controllers performs a step of monitoring a portion of the electrical power supply line between the master and slave controllers, by using an optical loop established on a portion of the optical transmission line between the master and slave controllers, and starting from the master controller and passing through the slave controller.

15 Claims, 4 Drawing Sheets

(51) Int. Cl.
*G01V 1/18* (2006.01)
*G01V 1/20* (2006.01)
*G01M 11/08* (2006.01)
G01R 31/08 (2006.01)
G01V 1/38 (2006.01)

(52) U.S. Cl.
CPC ............... *G01V 1/18* (2013.01); *G01V 1/201* (2013.01); *G01R 31/083* (2013.01); *G01V 1/38* (2013.01)

(56) References Cited

U.S. PATENT DOCUMENTS

| | | | |
|---|---|---|---|
| 6,588,266 B2* | 7/2003 | Tubel | E21B 23/03 250/255 |
| 9,074,742 B1* | 7/2015 | Petrocy | G09F 9/3026 |
| 9,519,278 B2* | 12/2016 | Petrocy | G05B 19/0421 |
| 2001/0023614 A1* | 9/2001 | Tubel | E21B 23/03 73/152.39 |
| 2002/0066309 A1* | 6/2002 | Tubel | E21B 23/03 73/152.54 |
| 2003/0205083 A1* | 11/2003 | Tubel | E21B 23/03 73/152.19 |
| 2015/0241497 A1* | 8/2015 | Sellin | G01R 15/24 702/58 |

FOREIGN PATENT DOCUMENTS

| | | | | |
|---|---|---|---|---|
| EP | 2910977 A1 | * | 8/2015 | ............. G01R 15/24 |
| GB | 2437840 A | | 11/2007 | |
| MX | 2015002157 A | * | 8/2015 | ............. G01R 15/24 |
| RU | 2015105994 A | * | 9/2016 | ............. G01R 15/24 |
| WO | 0048020 A2 | | 8/2000 | |
| WO | 2007111389 A1 | | 10/2007 | |

OTHER PUBLICATIONS

Office Action issued in the Mexican Patent Application dated Feb. 7, 2017.

* cited by examiner

METHOD FOR MONITORING AN ELECTRICAL POWER SUPPLY LINE COMPRISED IN A SEISMIC CABLE, CORRESPONDING SYSTEM, COMPUTER PROGRAM PRODUCT AND NON-TRANSITORY COMPUTER-READABLE CARRIER MEDIUM

1. CROSS-REFERENCE TO RELATED APPLICATIONS

This Application claims the benefit of European Patent Application No. EP14305240.5, filed on Feb. 21, 2014, which is incorporated by reference in its entirety.

2. FIELD OF THE INVENTION

The field of the invention is that of equipments for the seismic prospection, and more particularly seismic cables designed for hydrocarbon exploration.

More specifically, the invention pertains to a technique for monitoring an electrical power supply line comprised in a seismic cable.

The present invention can be applied notably, but not exclusively, to marine seismic prospection.

3. TECHNOLOGICAL BACKGROUND

It is sought more particularly here below in this document to describe problems existing in the field of marine seismic prospection. The invention of course is not limited tot his particular field of application but is of interest for any technique that has to cope with closely related or similar issues and problems.

In marine seismic exploration, the operations of acquiring seismic data on site conventionally use networks of sensors distributed along cables in order to form linear acoustic antennas, also referred to as "streamers" or "seismic streamers" or "seismic cables". The seismic streamers are towed through water behind a seismic vessel at a water depth that can be more or less deep.

In the following description, a seismic cable is understood to be a seismic streamer which can be maintained at a selected depth under the sea surface or a cable lying on the sea bed, for example in an Ocean Bottom configuration, also known as Ocean Bottom Cable (OBC) for seabed acquisition.

A c marine seismic method is usually based on analysis of reflected seismic waves. Thus, to collect geophysical data in a marine environment, one or more submerged seismic sources are activated in order to propagate seismic wave trains. The pressure wave generated by the seismic source passes through the column of water and insonifies the different layers of the sea bed. Part of the seismic waves (i.e. acoustic signals) reflected are then detected by the sensors (e.g. hydrophones, geophones, accelerometers or the like) distributed over the length of the seismic cables. These acoustic signals are processed and transmitted through the telemetry from the seismic cables to a central unit onboard the seismic vessel, where they are stored.

As shown in FIG. 1, a network of seismic cables 100 to 104 is towed by a seismic vessel 115. A seismic cable 100 generally comprises a plurality of controllers 20, such as telemetry modules, arranged along the seismic cable 100. Part of cable comprised between two controllers 20 forms a portion of cable. Each portion of cable is itself divided into a plurality of cable sections comprising each a plurality of seismic sensors, such as hydrophones or geophones or accelerometers, arranged along the section and adapted for detecting acoustic signals. The seismic cable 100 shown in FIG. 1 comprises, for example, two portions of cable P1 and P2 each comprising three cable sections S1 to S3 comprising seismic sensors for data acquisition. The seismic sensors are referenced 10 in FIG. 2, which illustrates in detail the block referenced A in FIG. 1, i.e. a portion P2 of the seismic cable referenced 100. Each cable section S1 to S3 may further comprise a plurality of nodes (not shown on the figures) distributed along the cable at intervals that are not necessarily regular.

These nodes are connected to the controllers via electrical wires (not shown on figures). More precisely, all the nodes are provided serially along the electrical wires from the head end of the seismic cable until the tail end of the seismic cable, with the controllers being distributed between groups of nodes on the electrical wires. A node is adapted for collecting seismic data issued from a given associated set of sensors 10 and to digitize them before sending them, via the controllers 20, to the central unit situated on the seismic vessel.

Controllers are assembled in series along the seismic cable and each associated with at least one of the nodes, each controller providing power supply and synchronization of the nodes wherewith it is associated. More precisely, the controllers concentrate the data issued from a plurality of nodes. Then, the controllers direct the concentrated data received from the nodes and the sensors upon data transmission lines (such as telemetry line 40) for carrying data from or towards the controllers 20, and to route said data towards the recorder vessel 115.

We will now explain in more details which functions are performed by each node and each controller.

Each node is made up of four basic components:
a sensing unit;
a processing unit;
a transceiver unit; and
a power unit.

Sensing units are usually composed of two subunits: sensors and analog-to-digital converters (ADCs).

The analog signals produced by the sensors based on the observed phenomenon are converted to digital signals by the ADC, and then fed into the processing unit. The processing unit, which is generally associated with a small storage unit for buffering, manages the procedures that make the nodes collaborate with the other nodes to carry out the assigned sensing tasks. A transceiver unit connects the node to the network.

If sensors are analog sensors (such as geophone or hydrophone), each node performs the analog to digital conversion of the signal from sensors. If sensors are digital (sensors are micro-machined accelerometer for example), no conversion is performed by the corresponding node. Then, these data are sent to a central data processing unit onboard the recorder vessel 115 via the network of data transmission lines. More precisely, each node has the capabilities to collect data and route data back to a controller 20. The data are conventionally sent from the nodes to the central processing unit via controllers 20.

Each controller performs different functions, including:
power supply of the nodes via an high voltage rails;
synchronization of the data;
data retrieval from the nodes through electrical wires;
local storage for buffering of the seismic data;

data routing through the data transmission lines (such as optical telemetry line 40) towards the recorder vessel 115;

interface with the recorder vessel 115 (processing of commands received from the recorder vessel 115);

pre-processing of the data coming from the nodes.

The nodes and controllers are thus devised to only perform signal processing functions. In other words, the nodes and controllers progressively return the seismic data to the central processing unit.

The power supplying lines supply the controllers and the sensors with a high voltage (such as a voltage about 300V-1000V), so as to limit the level of current in said power supplying lines.

A module of each controller converts the High Voltage received from a power supplying line to a Low Voltage to power the seismic sensors bi-directionally via the power lines. As already explained, the controllers also retrieve and process data from the seismic sensors connected on each side, via electrical wires, and operate interface between the sensors and the data transmission lines 40 by directing the data received from the sensors on the data transmission lines 40.

In the example of FIG. 2, each cable section S1 to S3 has a connector on each of its ends, namely: connectors $O1_1$, $O1_2$ for the section S1, connectors $O2_1$, $O2_2$ for the section S2 and connectors $O3_1$, $O3_2$ for the section S3. Each controller $20_1$ and $20_2$ has a connector on each of its ends, namely: connectors $Om_1$, $Om_2$ for the controller $20_1$ and connectors $Os_1$, $Os_2$ for the controller $20_2$. A connector of a given section is adapted to connect a connector of a section adjacent to said given section, or a connector of a controller adjacent to said given section, so as to allow an electrical and/or optical interconnection when connected.

FIG. 2 illustrates the configuration of a common seismic cable which comprises:

a data transmission line 40 (also called telemetry line) extending along the seismic cable 100 for carrying data from or towards the controllers 20, a high voltage electrical power supply line 50 extending along the seismic cable 100 for supplying power to the controllers 20 arranged on the cable 100.

The data transmission line 40 is generally consisted of a set of electrical copper wires for carrying electrical signals and/or a set of optical fibers for carrying optical signals from or towards the controllers 20. The data conveyed by the transmission line 40 belongs to the group comprising: seismic data issued from sensors 10 and control data issued from nodes (for example results of tests on sensors), control data issued from a master controller to a slave controller and/or from a slave controller to a master controller (for example leakage of a controller, overconsumption of a controller).

The electrical power supply line 50 is adapted for supplying in cascade pairs of master and slave controllers 20 on portions of the electrical power supply line 50. Generally speaking, a master controller of a pair of master and slave controllers is responsible for monitoring the portion of electrical power supply line comprised between this pair of master and slave controllers. For example, on the seismic cable portion P2 illustrated in FIG. 2, the master controller $20_1$ is responsible for managing the electrical power supply to the slave controller $20_2$. The master controller $20_1$ also monitors the electrical power supply of nodes arranged along the cable portion P2.

It should be noted that the master controller manages the power supply to the slave controller which can be placed before (i.e. vessel side, as illustrated on FIG. 2) or after (i.e. seismic cable end side), and not necessary immediately adjacent to the master controller. In the example of FIG. 2, the slave controller $20_2$ is placed immediately adjacent to the master controller $20_1$, so that the power supply is carried out for two immediate successive master and slave controllers. This is, of course, a particular embodiment of implementation.

In marine seismic exploration, due to the length of the seismic cable, the controllers are supplied with high voltage from the seismic vessel (typically comprised between 300 and 900 V) via the electrical power supply line 50, which poses problems of safety.

In order to prevent possible risks of electrocution or physical damage when the seismic cable is damaged or is open, each portion of seismic cable 100 comprised between a master controller $20_1$ and the slave controller $20_2$ is equipped with a safety loop that allows to stop the high voltage supply if necessary. As shown on FIG. 2, the safety loop SL is composed of a pair of two electrical copper wires 61, 62 comprised between the master $20_1$ and slave $20_2$ controllers. The pair of electrical copper wires 61 and 62 are connected via an impedance element 63, of specific impedance value, which is comprised in the slave controller $20_2$. A measurement unit 64 placed within the master controller $20_1$ is adapted for performing an impedance measurement.

If the impedance measured by the measurement unit 64 is equal to said specific impedance value 63, this means that the safety loop is closed. In that case, the master controller $20_1$ can propagates (or continues to propagate) the high voltage to the slave controller $20_2$ via the portion of the electrical power supply line 50 comprised between these two controllers.

If the impedance tends towards infinity, this means that the safety loop is open and so the seismic cable 100 is open or damaged. In that case, the master controller $20_1$ must stop (or not launch) the electrical supply sent to the slave controller $20_2$ to allow interventions (seismic cable retrieving, fault or damage location, change of deficient portion or elements of the cable, etc.).

However, this known solution has a number of drawbacks. The use of a safety loop based on electrical impedance measurement requires two additional electrical copper lines per electrical power supply wire (a line electrical power supply line typically comprises a set of two electrical power supply wires), which has a significant impact on the overall weight and size of the seismic cable, but also on the size of the connectors.

4. SUMMARY OF THE INVENTION

A particular embodiment of the invention proposes a method for monitoring an electrical power supply line comprised in a seismic cable and extending along said seismic cable, said seismic cable further comprising:

a plurality of seismic sensors arranged along the seismic cable, a plurality of controllers arranged along the seismic cable, an optical transmission line extending along said seismic cable for carrying data signals from or towards said controllers, said electrical power supply line supplying at least one pair of master and slave controllers.

The method is characterized in that, for at least one given pair of master and slave controllers, the master controller performs a step of monitoring a portion of said electrical power supply line comprised between said master and slave controllers, by using an optical loop established on a portion of said optical transmission line comprised between said master and slave controllers. The optical loop starts from the master controller and passes through the slave controller.

The invention thus allows, in taking advantage of the optical architecture present within the seismic cable, to implement a purely optical monitoring of the electrical power supply line. Indeed, the invention relies on the astute using of the optical transmission line usually used for conveying optical signals, to implement a new function consisting in verifying the proper functioning of the electrical power supply line. At this end, an optical loop is established on the optical transmission line portion comprised between a pair of master and slave controllers, to check the proper functioning of the electrical supply line portion comprised between said pair of controllers and thereby avoiding any possible accidental exposure to high voltage in the event of opening of the electrical supply line. Thus, thanks to this optical configuration, the monitoring system according to the invention does not require any conventional electrical loop to ensure the electrical power supply line monitoring. This therefore enables to reduce the streamer weight and offers a cost-effective seismic cable.

It should be noted that the master controller manages the power supply to the to the slave controller which can be placed before or after the master controller, and adjacent or not to the master controller.

According to a particular feature, the master controller further performs the steps of:
 emitting an optical test signal through the portion of said optical transmission line comprised between said master and slave controllers,
 receiving an optical return signal supposed to result from a reflection of said test signal by the slave controller,
said step of monitoring the portion of said electrical power supply line being performed as a function of said return signal.

The principle of the invention thus relies on the measurement, by the master controller, of reflection of an optical signal on the slave controller in order to ensure that the electrical supply line is not open. The principle is aimed at verifying the seismic cable is not open by verifying the optical transmission line portion comprised between two controllers is not open.

According to a particular feature, the master controller further performs:
 a step of determining an effective propagation duration elapsed between an emission instant of said optical test signal and a reception instant of said optical return signal;
 a first step of comparing the effective propagation duration with a first reference propagation duration which is as a function of a predetermined distance separating the master and slave controllers;
 a step of obtaining a first piece of monitoring information as a function of the result of said first step of comparing.

This first piece of monitoring information can be thus used for detecting default on the electrical power supply line:
 if the effective propagation duration is identical to the first reference propagation duration, this means that the electrical power supply line portion comprised between the master and slave controllers works properly. In other words, the electrical power supply line portion is considered as being not open or not damaged;
 if the effective propagation duration is different from the first reference propagation duration, this means that the electrical power supply line portion has a fault. In other words, the electrical power supply line portion considered as being open or disconnected or broken.

According to a particularly advantageous feature, said at least one given pair of master and slave controllers being separated by a cable portion comprising a plurality of cable sections, each cable section having an optical connector on both ends of said cable section, the master controller further performs, if the effective propagation duration is different from the first reference propagation duration:
 a second step of comparing the effective propagation duration with at least one second reference propagation duration, each being as a function of a predetermined distance separating said master controller and one of said optical connectors of the cable portion;
 a second step of obtaining a second piece of monitoring information as a function of the result of said second step of comparing.

This second piece of monitoring information makes it possible to detect a failure location of the electrical power supply line. Thus, contrary to the conventional method of monitoring, the method according to the invention enables to know in which cable section of the cable portion the failure occurred. This makes the intervention and maintenance times on the electrical power supply line much easier and faster. This relies on the use of the presence of optical connectors along the seismic cable, to establish an optical sub-loop starting from the master controller and passing through the last connector on which the signal is reflected, which provides useful additional information on the location of a failure detected on the seismic cable.

According to a first exemplary embodiment, the master controller further performs the steps of:
 processing said first piece of monitoring information and/or said second piece of monitoring information,
 delivering a positive or negative decision to stop supplying said slave controller via the portion of said electrical power supply line, as a function of the result of said step of processing.

In this exemplary embodiment, a local processing of monitoring information can be thus carried out at the slave controller level to take a decision to stop supplying the slave controller of said electrical power supply line portion.

According to a second exemplary embodiment, the master controller further performs a step of sending said first second piece of monitoring information and/or said second piece of monitoring information to a remote control system, accompanied with an identifier of said master controller, so as to take a positive or negative decision to stop supplying on said electrical power supply line.

In this exemplary embodiment, the processing of monitoring information can be carried out at a remote location, for example by a control system placed on-board a vessel (towing the seismic cable), to take a decision to stop supplying the electrical power supply line. The identifier enables the control system to identify the master controller concerned and thus the portion of electrical power supply line concerned.

In another embodiment, the invention pertains to a system for monitoring an electrical power supply line comprised in a seismic cable and extending along said seismic cable, said seismic cable further comprising:
 a plurality of seismic sensors arranged along the seismic cable,
 a plurality of controllers arranged along the seismic cable, an optical transmission line extending along said seismic cable for carrying data signals from or towards said controllers, said electrical power supply line supplying in cascade a succession of pairs of master and slave controllers on a succession of portions of said electrical power supply line. The system is characterized in that it comprises, for at least one given pair of master and slave controllers:

optical means arranged to cooperate with a portion of said optical transmission line comprised between said master and slave controllers so as to form an optical loop starting from the master controller and passing through the slave controller, means for monitoring, using said optical loop to monitor a portion of said electrical power supply line comprised between the master and slave controllers.

Thus, this particular embodiment relies on a wholly novel and inventive approach taking advantage of the optical transmission line usually used for conveying optical signals, to implement an optical loop enabling to check the proper functioning of the electrical power supply line. The principle of the invention indeed consists in verifying the seismic cable is not open by verifying the optical transmission line portion comprised between two controllers is not open. Thus, thanks to this optical configuration, the monitoring system according to the invention does not require any dedicated electrical monitoring loop to ensure the electrical power supply line monitoring. This enables a simple and cost-effective implementation of the monitoring system.

According to a particular feature, said optical means comprise:

on the master controller side:
  an optical source arranged for generating an optical test signal through the portion of said optical transmission line,
  an optical sensor arranged for receiving an optical return signal supposed to result from a reflection of said optical test signal by light signal reflecting means comprised within the slave controller,
on the slave controller side:
  said light signal reflecting means arranged for reflecting said optical test signal coming from the master controller.

The optical loop aims at verifying the seismic cable is not open by verifying the optical transmission line portion comprised between two controllers is not open. The principle is based on the measurement, by the master controller, of reflection of an optical signal on the slave controller in order to ensure that the electrical supply line is not open.

According to a particular feature, said means for monitoring comprise means for processing the optical return signal received by the optical sensor.

According to a particular feature, said light signal reflecting means comprise a device having a return loss coefficient which is upper than −15 dB.

According to a particular feature, said light signal reflecting means comprise a device belonging to the following group:

an optical reflective mirror;
a disconnected right-cleaved physical contact optical connector.

This list is not exhaustive.

The reflective mirror can be obtained by means of an optical fiber whose end is polished to act as mirror reflecting the optical signal from the optical source through an angle of approximately 180 degrees along the axis of the fiber.

More broadly, the light signal reflecting means can be any device that comprises an at least partially reflective surface.

According to a particular feature, said at least one given pair of master and slave controllers are separated by a cable portion comprising a plurality of cable sections, each cable section comprising an optical connector on both ends of said cable section having a return loss coefficient which is upper than −15 dB when disconnected.

Thus, an optical connector disconnected is detected as a function of its return loss coefficient, which enables to easily locate which cable section is defective.

More particularly, each optical connector is a right-cleaved physical contact optical connector. This kind of connectors costs little. A right-cleaved physical contact means that the contact area of each connector coupled is polished without angle.

According to a particular feature, the seismic cable belongs to the group comprising:

a seismic streamer;
an ocean bottom cable.

In another embodiment, the invention pertains to a computer program product comprising program code instructions for implementing the above-mentioned method (in any of its different embodiments) when said program is executed on a computer or a processor.

In another embodiment, the invention pertains to a non-transitory computer-readable carrier medium, storing a program which, when executed by a computer or a processor causes the computer or the processor to carry out the above-mentioned method (in any of its different embodiments).

5. LIST OF FIGURES

Other features and advantages of embodiments of the invention shall appear from the following description, given by way of an indicative and non-exhaustive examples and from the appended drawings, of which:

FIG. 1, already described with reference to the prior art, presents an example of network of seismic cables towed by a seismic vessel;

FIG. 2, already described with reference to the prior art, illustrates in detail the classic structure of a portion of seismic cable of FIG. 1;

FIG. 3 provides, in the form of function blocks, a schematic illustration of the system according to a particular embodiment of the invention;

FIG. 4 provides an example of chronograms showing the time evolution of the optical emission and reception level measured by a master controller to illustrate the principle of detecting a failure location on the electrical power supply line comprised between a master controller and a slave controller;

6. DETAILED DESCRIPTION

In all of the figures of the present document, identical elements and steps are designated by the same numerical reference sign. The invention relies on the use of a safety optical loop to carry out the monitoring of an electrical power supply line within a seismic cable.

The seismic cable according to the invention comprises:
a plurality of seismic sensors arranged along the seismic cable,
a plurality of controllers arranged along the seismic cable,
an electrical transmission line (not shown on FIGS. 3 to 6) extending along the seismic cable for conveying electrical data signals between controllers and nodes,
an optical transmission line extending along the seismic cable for conveying optical data signals from or towards the controllers, and from or towards the seismic vessel.
an electrical power supply line supplying power to the controllers.

The electrical transmission line typically comprises at least one pair of copper wires. It conveys electrical data comprising notably, but not exclusively, seismic data and test data between the controllers and nodes. The electrical transmission line is further used for powering the nodes arranged on the cable with a low voltage power.

The optical transmission line typically comprises one or several optical fibers which convey optical data comprising notably, but not exclusively, seismic data and control data from master controller to slave controller and/or from slave controller to master controller. The optical transmission line typically cooperates with an optical light source (hereafter referenced as "Tx") comprised in the master controller and with an optical light receiver (hereafter referenced as "Rx") comprised in the slave controller, used respectively for optical data transmission and reception.

Figure 1:
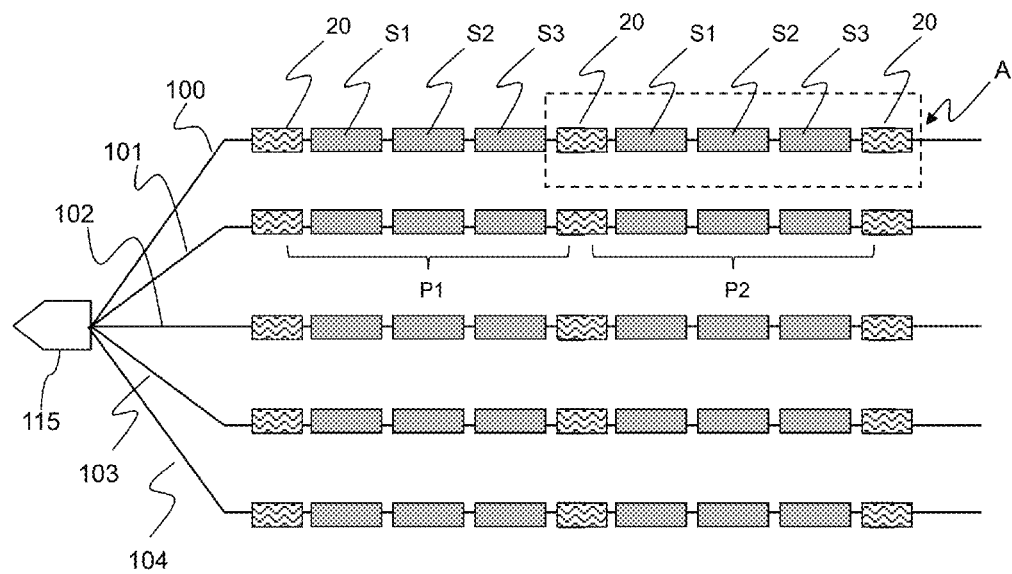
Figure 2:
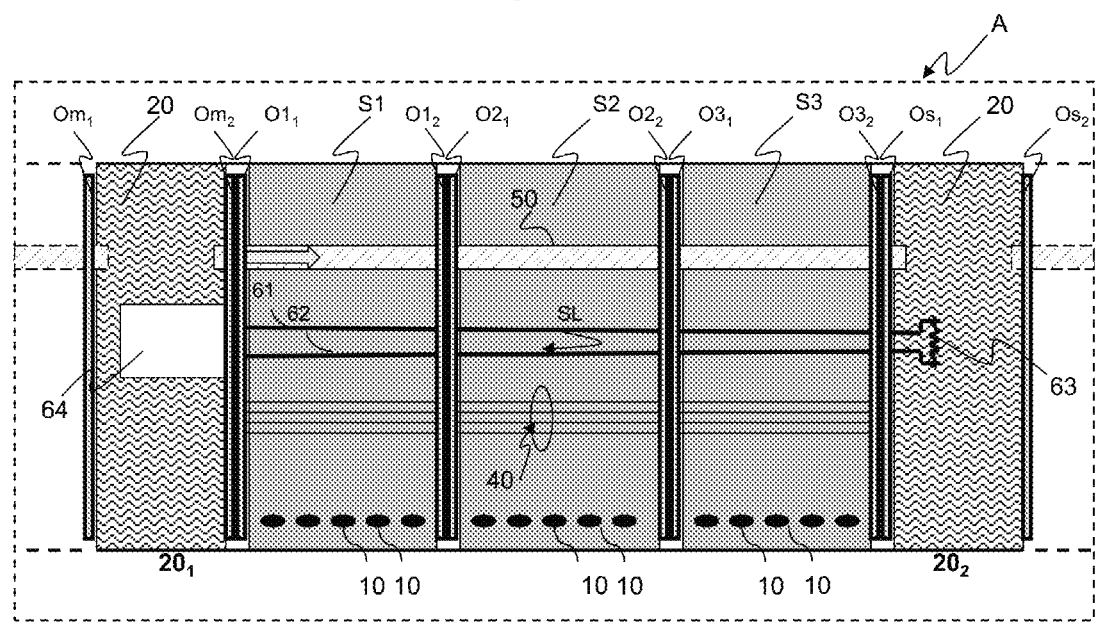
Figure 3:
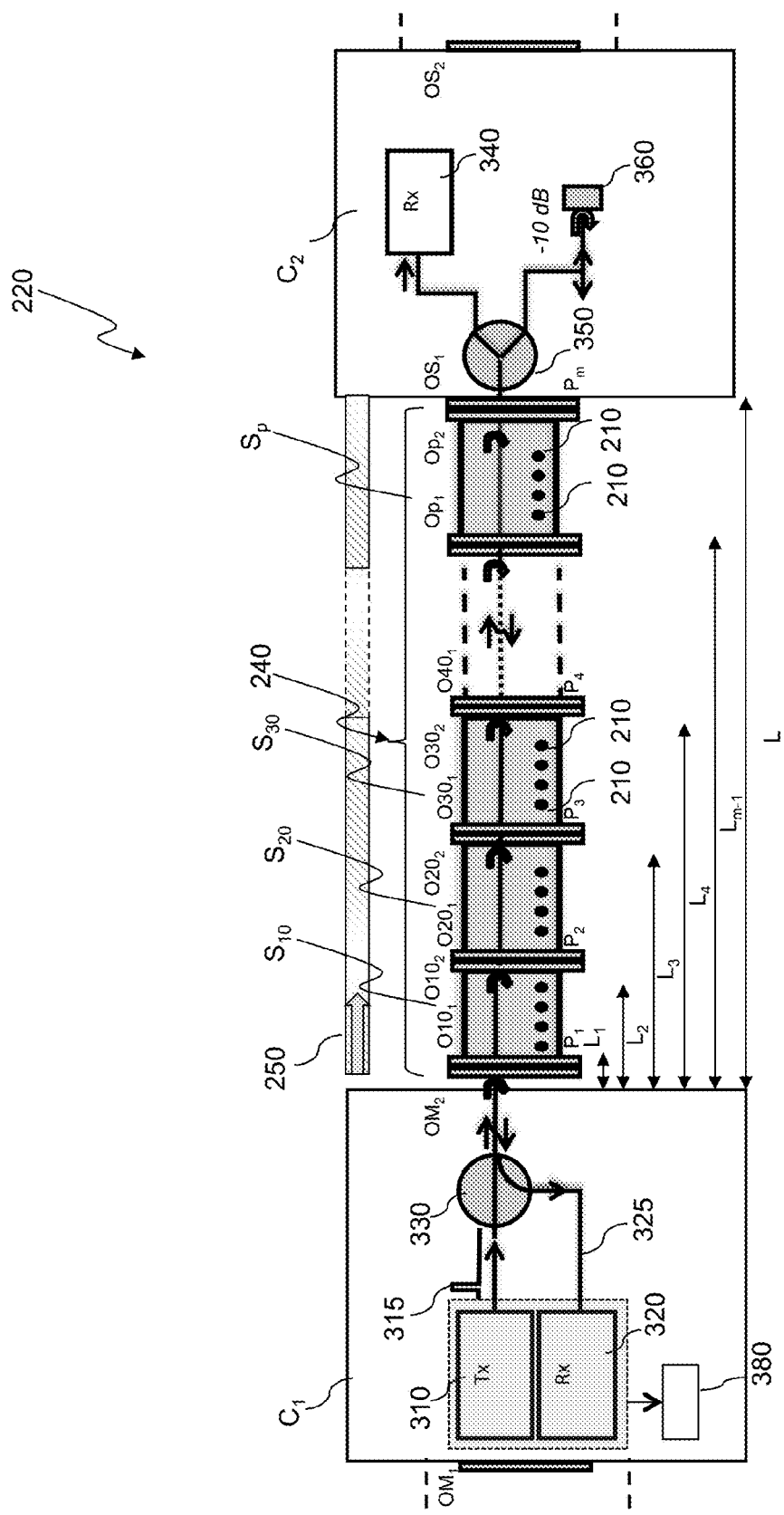

FIG. 3 illustrates a particular embodiment of the monitoring system according to the invention, implemented in a portion 220 of a seismic cable, for example the seismic cable 100 illustrated on FIG. 1. The seismic cable portion 220 is comprised between a master controller $C_1$ and a slave controller $C_2$, the master controller $C_1$ managing the power supply of the slave controller $C_2$.

The seismic cable portion 220 is divided into a set of successive cable sections dedicated to data acquisition, referenced $S_{10}, S_{20}, S_{30}, \ldots S_p$. Each cable section may comprise a plurality of nodes (not shown on the figures) distributed along the cable at intervals that are not necessarily regular. As explained above, a node is adapted for collecting seismic data issued from a given associated set of sensors 210 and to digitize them before sending them, via the controllers, to the central unit situated on the seismic vessel. The seismic sensors 210, such as hydrophones or geophones or accelerometers, are arranged along the section and are adapted for detecting acoustic signals.

Each cable section comprises an optical connector on both ends, adapted for allowing a mechanical and optical interconnection with another cable section or with a controller. The cable section $S_{10}$ has the optical connectors $O10_1, O10_2$. The cable section $S_{20}$ has the optical connectors $O20_1, O20_2$. The cable section $S_{30}$ has the optical connectors $O30_1, O30_2$. The cable section $S_p$ has the optical connectors $OP_1, OP_2$.

The master controller $C_1$ has a connector on each of its ends, namely the connectors $OM_1, OM_2$. The slave controller $C_2$ has a connector on each of its ends, namely the connectors $OS_1, OS_2$. The connector $OM_2$ is adapted to mat with the connector $O10_1$ of the first section $S_{10}$ of the cable portion 220, whereas the connector $OM_1$ is adapted to mat with a connector of a section of another cable portion not shown on the figure. The connector $OS_1$ is adapted to mat with the connector $Op_2$ of the last section $S_p$ of the cable portion 220, whereas the connector $OS_2$ is adapted to mat with a connector of a section of another cable portion not shown on the figure.

It is considered below that two connectors connected (of two sections or of a controller and a section), form a pair of connectors.

According to an advantageous feature, the optical connectors are of the type that have a return loss coefficient upper than −15 dB when they are disconnected (or not connected). For example, each optical connector illustrated on FIG. 3 is right-cleaved physical contact optical connectors (for a right-cleaved physical contact, the contact area between two connectors coupled is polished without angle, in opposition with the connectors APC ("Angled Physical Contact") where the contact area between two connectors is polished with an angle of 8 or 9 degrees. On APC connectors, the return loss is lower than −30 dB even if the optical connector is disconnected).

It should be noted that each cable section comprises seismic sensors and nodes distributed along the cable at intervals that are not necessarily regular. A node is adapted for collecting and processing seismic data issued from a given set of sensors 210, then to sent them to the central unit situated on the seismic vessel via the controllers. The nodes are not shown on the figures to avoid overburdening them.

The seismic cable portion 220 further comprises a portion of the optical transmission line, referenced 240, and a portion of the electrical power supply line, referenced 250.

The operating principle of the invention is based on the addition of optical means arranged to cooperate with the portion 220 of the optical transmission line comprised between the pair of master and slave controllers $C_1, C_2$ so as to form an optical loop, starting from the master controller $C_1$ and passing through the slave controller $C_2$. The optical means according to the invention comprises:
on the master controller side ($C_1$):
an optical source 310 (also referenced as "Tx" on the figure) arranged for generating an optical test signal 315 through the portion of the optical transmission line,
an optical sensor 320 (also referenced as "Rx" on the figure), such as a photodiode, arranged for receiving a optical return signal 325 supposed to result from a reflection of the optical test signal by light signal reflecting means 360 comprised within the slave controller $C_2$,
light beam splitter 330, arranged between the optical source 310 and the portion 240 of the optical transmission line, for deviating the return signal, coming from the slave controller $C_2$, onto the optical sensor 320,
on the slave controller side ($C_2$):
light signal reflecting means 360 (such as an optical reflective mirror or a disconnected optical fiber connector for example), arranged at the end of optical line, for reflecting the optical test signal coming from the master controller $C_1$,
light beam splitter 350, arranged between the portion 240 of the optical transmission line and an optical receiver 340, for deviating the test signal, coming from the master controller $C_1$, onto the light signal reflecting means 360.

The optical loop is designed to operate as follows. In operation, the optical source 310, comprised in the master controller $C_1$, injects a light pulse 315 of known amplitude, acting as a test signal, over the portion 240 of the optical transmission line. If the cable portion 220 has no defect (i.e. is not open or defective), the light pulse 315 goes through the optical transmission line portion 240 towards the slave controller $C_2$, takes a deflection via the light beam splitter 350 in order to be directed to the optical reflective mirror 360. The light pulse 315 reflected by the mirror 360 forms a return signal that is then injected over the portion 240 of the optical transmission line via the light beam splitter 350. The return signal 325 goes through the optical transmission line portion 240 towards the master controller $C_1$, and takes a deflection via the light beam splitter 330 in order to be directed to the optical sensor 320.

The master controller $C_1$ further comprises a monitoring unit 380 that uses this optical loop established on the portion 240 of optical transmission line, to monitor the portion 250 of the electrical power supply line comprised between the master $C_1$ and slave $C_2$ controllers. If the optical loop is detected as being closed, the monitoring unit 380 considers the portion 250 of the electrical power supply line has no defect. If the optical loop is detected as being open, the monitoring unit 380 considers the portion 250 of the electrical power supply line defective.

The principle of the invention is therefore of checking, thanks to the optical loop, if the seismic cable is not open or defected by checking that the optical transmission line portion is not cut.

The electrical power supply line monitoring is carried out by means of a processing of the optical return signal, described in detail below in relation with FIGS. 4 and 5. A processing unit comprised in the monitoring unit 380 performs this return signal processing.

An optical circulator is rather used as a light beam splitter when the optical transmission line is based on a bidirectional communications on one fiber schema and a coupler (cooperating with an isolator) is rather used as a light beam splitter when the optical transmission line is based on a unidirectional communications schema.

Figure 5:
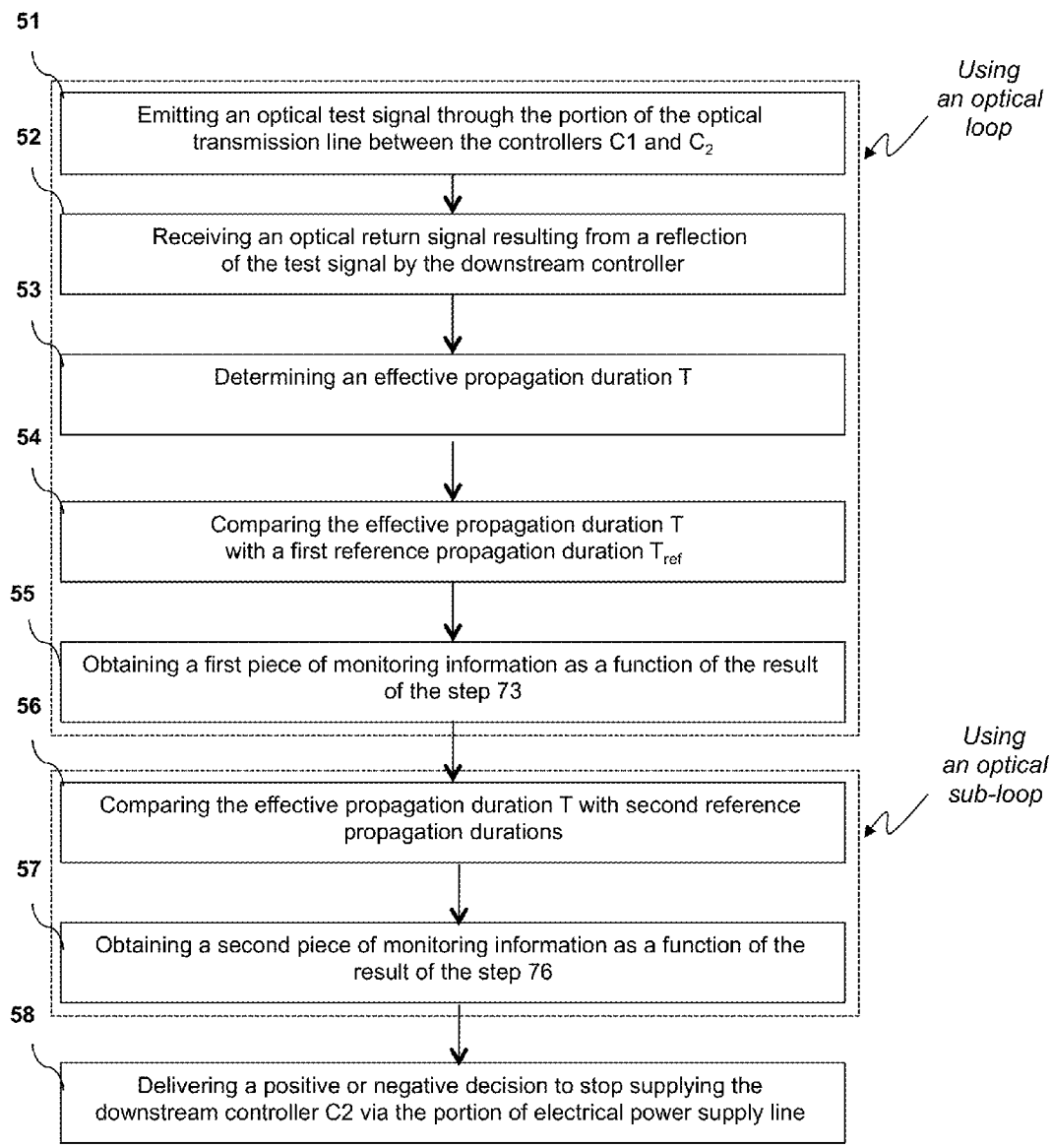
FIG. 5 is a flowchart of a particular embodiment of the method according to the invention, implemented by a master controller.

FIG. 5 is a flowchart of a particular embodiment of the method according to the invention, implemented by the master controller $C_1$ of FIG. 3. This algorithm more particularly synthesizes the running of the different steps needed for monitoring the portion 250 of the electrical power supply line of a seismic cable.

Using an Optical Loop

At the step 51, the master controller $C_1$ sends, via the optical source 310, the optical controller test signal 315 through the portion 240 of the optical transmission line between the master controller $C_1$ and slave controller $C_2$. An example of test signal emitted by the controller $C_1$ is represented on the chronogram (A) of FIG. 4.

At the step 52, the master controller $C_1$ receives, via the optical sensor 320, an optical return signal 325. This return signal 325 is supposed to result from a reflection of the optical test signal 315 by the slave controller, and more precisely by the optical reflective mirror 360 comprised in the slave controller $C_2$. An example of a return signal received by the controller $C_1$ is represented on the chronogram (B) of FIG. 4. The return signal illustrated here is the reference optical signal resulting from the reflection of the optical test signal on the reflective mirror 360 arranged at the end of optical line. The reflective mirror 360 has typically a return loss coefficient typically upper than −15 dB.

The master controller $C_1$ then processes the optical return signal 325.

At the step 53, the master controller $C_1$ determines the effective duration (T) elapsed between an emission instant of the test signal 315 and a reception instant of the optical return signal 325, in order to compare it with a reference duration of a first type, hereafter referenced $T_{ref}$.

The reference duration of the first type $T_{ref}$ is understood to be the expected propagation duration necessary to an optical signal to propagate on the optical loop, starting from the master controller $C_1$, passing through the slave controller $C_2$ and coming back to the master controller $C_1$.

In a general manner, the optical loop is characterized by a reference duration of the first type $T_{ref}$ defined as follow:

$$T_{ref} = 2L/nc$$

with:
L, the distance comprised between the controllers $C_1$ and $C_2$;
n, the index of refraction of the optical fiber concerned in the optical transmission line;
c, the speed of light in the medium of the index n (typically $c=3\cdot10^8$ m·s$^{-1}$).

At the step 54, the master controller $C_1$ makes a check to see if the effective duration T determined in the previous step is equal to the reference duration of the first type $T_{ref}$.

If the effective duration T is equal to the reference duration of the first type $T_{ref}$, the master controller $C_1$ considers that the portion 250 of the electrical line supply line has no failure. Indeed, a positive result of the check step means that the optical loop is closed and the controller master controller $C_1$ can propagate or continues to propagate the high voltage to the slave controller $C_2$ via the electrical line portion 250.

If the effective duration T is different from the reference duration of the first type $T_{ref}$, the master controller $C_1$ considers that the portion 250 of the electrical line supply line is open or defective. Indeed, a negative result of the check step means that the optical loop is open and the controller master controller $C_1$ must stop supplying the slave controller $C_2$ or not propagate the high voltage to the slave controller $C_2$ via the electrical line portion 250.

At the step 55, the master controller $C_1$ generates a first piece of monitoring information as a function of the result of the step 54:
in case of positive result (T=Tref), the electrical power supply line is detected as operational,
in case of negative result (T≠Tref), the electrical power supply line is detected as defective.

In other words, this first piece of monitoring information is used to know if the electrical line portion 250 is considered as being defective or not defective.

Using an Optical Sub-loop

A negative result of the step 54 means that either no optical return signal has been detected by the optical sensor 320 or the optical return signal 325 detected by the optical sensor 320 does not result from a reflection of the optical test signal 315 by the slave controller $C_2$, but results from a reflection of the optical test signal 315 by one of the pairs of connected optical connectors ($OM_2$-$O10_1$ (called $P_1$); $O10_2$-$O20_1$ (called $P_2$); $O20_2$-$O30_1$ (called $P_3$); $O30_2$-$O40_1$ (called $P_4$) ... $Op_i$-$OS_1$ (called $P_m$)) of the cable portion 220. In the both cases, the electrical line portion 250 is considered as being open or defective.

The master controller $C_1$ makes, at the step 56, a comparison between the effective duration T determined in the step 53 (i.e. duration elapsed between the emission instant of the test signal 315 and the reception instant of the optical return signal 325) and reference durations of a second type, hereafter referenced reference durations $T_x$.

A reference duration of the second type $T_x$ is understood to be the propagation duration necessary to an optical signal to propagate on an optical sub-loop starting from the master controller $C_1$, passing through the pair of optical connector $P_x$, and coming back to the master controller $C_1$.

In a general manner, the optical sub-loop is characterized by a reference duration of the second type $T_x$ defined as follow:

$$T_x = 2L_x/nc$$

with:

$L_x$, the distance comprised between the controllers $C_1$ and the optical connector of index x, with $1 \leq x \leq m$, x being an integer comprised between 1 and m being the number of pairs of connected optical connectors arranged on the optical transmission line portion;

n, the refractive index of the optical fiber concerned in the optical transmission line;

c, the speed of light in the medium of the refractive index n (typically $c = 3 \cdot 10^8$ m·s$^{-1}$).

Indeed, when an optical right cleaved physical contact connector is disconnected on the optical transmission line portion 240, this last has the capacity of reflecting at least partially the optical test signal 315 sent by the optical source 310.

It should be noted that with other types of optical connectors like angle cleaved physical contact connectors (APC connectors) or expanded beam connectors, the signal reflected by the connector is very low (<−50 dB or −30 dB) that which is difficult to detect with standard components used for transmission, and this value is the same as the connector is connected or disconnected. It should be noted that the optical return signal to be take into account by the master controller $C_1$ for the signal processing is the one that results from a reflection on the last optical connector placed slave along the optical transmission line portion. Due to the presence of a plurality of optical connectors, and so the plurality of return signals, it is important to note that only the last return signal received by the controller $C_1$ is taken into account in the processing.

Figure 4:
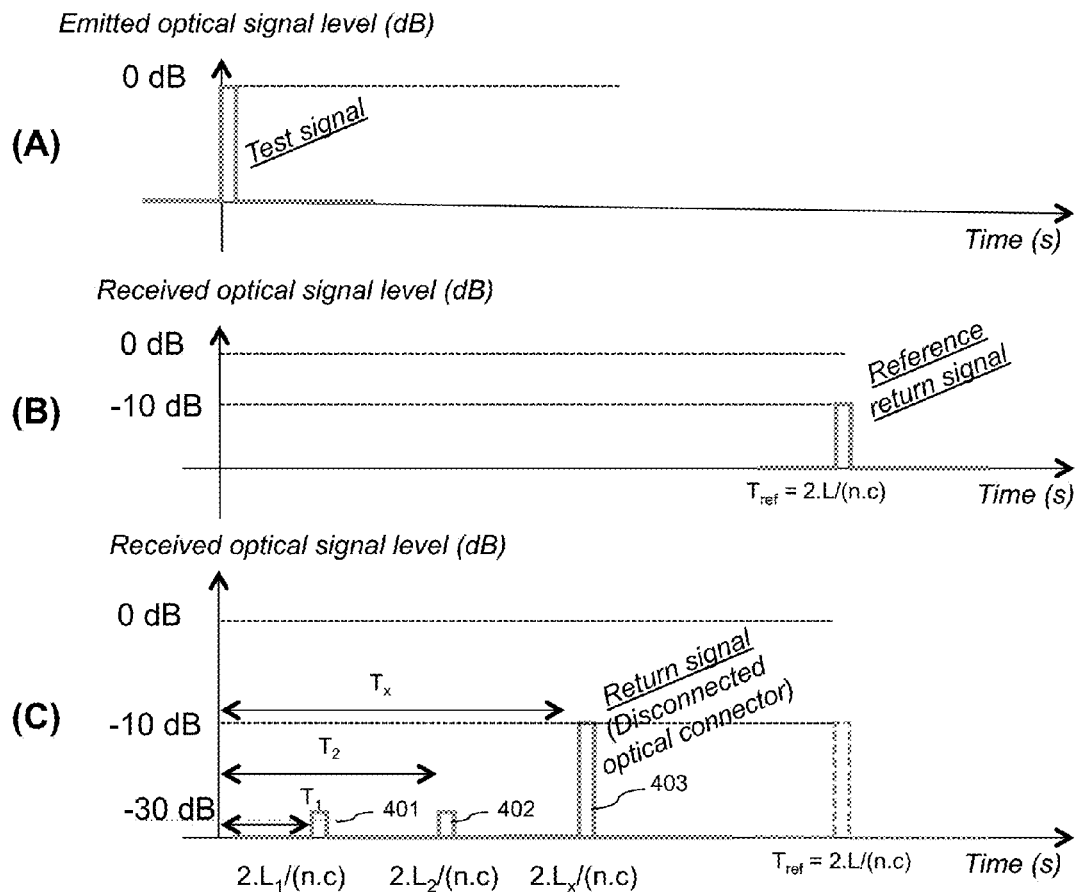

The chronogram (C) of FIG. 4 illustrates the reception level of the optical return signals received by master controller C1 and that results from reflections of the test signal 315 on the pairs of optical connectors $P_1$, $P_2$ et P. The signals 401 and 402 results from a reflection of the test signal by the pairs of connected optical connectors $P_1$, $P_2$ respectively. The return signal 403 is the last return signal received by the optical sensor 320. It results from a reflection of the test signal by the pair of optical connector $P_x$ which is the last slave connector capable of reflecting the optical signal.

It should be noted that when a right-cleaved physical contact optical connector is disconnected, it has a return loss level (loss of optical signal power resulting from the reflection caused by a discontinuity) (typically upper than −15 dB), which is much higher than the same optical connector but connected (typically equal to −30 dB).

The effective duration T determined in the step 53 is then compared with the reference durations of the second type $T_1$, $T_2$, $T_3$, ..., $T_m$.

If the master controller $C_1$ detects that the effective duration T determined in step 53 for the last return signal received is identical to the reference duration of the second type $T_3$ for example, this means that a failure or an opening has been detected and located slave the third pair of optical connector $P_3$ (x=3) on the cable portion 220.

At the step 57, the master controller $C_1$ generates a second piece of information relative to the location of a failure detected on the electrical power supply line comprised between the two controllers $C_1$ and $C_2$.

The principle here is thus of detecting the furthest slave optical sub-loop not open in order to provide an additional piece of information on the location of a failure detected on the seismic cable.

At the step 58, the master controller $C_1$ then delivers a decision to stop supplying the slave controller $C_2$ via the portion 250 of the electrical power supply line as a function of the first piece of monitoring information and/or the second piece of monitoring information. Therefore, it is possible not only to stop supplying the slave controller $C_2$ if the portion of electrical power supply line is detected as defective, but it is also possible to have a piece of information on the location of the failure detected on the electrical power supply line.

It should be noted that the decision-making process performed at the step 58 can be implemented either by the master controller $C_1$ as described above or by a remote control system. In the second embodiment, the processing of monitoring information can be carried out at a remote location, for example by a control system placed on-board the 115 vessel, to take a decision to stop supplying the electrical power supply line. However, a step of sending the first second piece of monitoring information and/or the second piece of monitoring information to a remote control system must be done by the controller $C_1$ prior the execution of step 58. An identifier enables the remote control system to identify the master controller $C_1$ concerned can be also sent with the monitoring information.

In addition, it should be noted that the method described above can be executed either before starting to supply the electrical power supply line (at seismic cable level or at seismic cable portion level) or during operation, for example implemented at regular time interval during optical data communications.

It should be noted that the technique of monitoring according to the invention can be implemented by a master controller for which the slave controller is placed immediately following (or preceding) the master controller along the seismic. But it can also be implemented by a master controller for which the slave controller is not the immediate successive (or preceding) controller but a following (or preceding) controller separated from the slave controller by at least one controller.

It should be further noted that the technique of monitoring according to the invention can be implemented in a bidirectional way. Indeed, the power supply can be carried out from a master concentrator placed at cable end side towards a slave concentrator placed nearer the seismic vessel, and vice versa.

Figure 6:
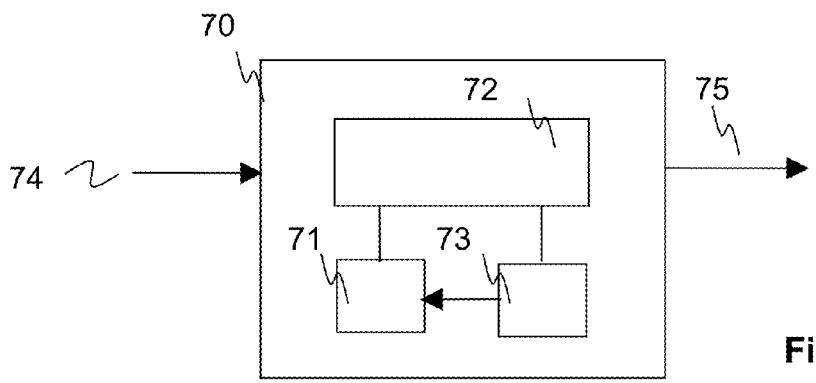
FIG. 6 shows the simplified structure of a controller according to a particular embodiment of the invention.

FIG. 6 shows the simplified structure of a monitoring device 70 according to a particular embodiment of the invention. The monitoring device 70 can be the monitoring unit 380 comprised in the master controller $C_1$ of FIG. 3 for example.

The monitoring device 70 comprises a non-volatile memory 73 (e.g. a read-only memory (ROM) or a hard disk), a volatile memory 71 (e.g. a random access memory or RAM) and a processor 72. The non-volatile memory 73 is a non-transitory computer-readable carrier medium. It stores executable program code instructions, which are executed by the processor 72 in order to enable implementation of the method described above in relation with FIG. 5 (method for monitoring an electrical power supply line comprised in a seismic cable).

Upon initialization, the aforementioned program code instructions are transferred from the non-volatile memory 73 to the volatile memory 71 so as to be executed by the processor 72. The volatile memory 71 likewise includes registers for storing the variables and parameters required for this execution. The processor 72 receives an optical return signal (referenced 74) supposed to result from a reflection of a test signal by the slave controller and carries out the electrical power supply line monitoring as a function of the return signal (corresponding to the steps 52 to 58).

According to the program code instructions, the processor 72 executes the program code instructions allowing to the device to deliver a decision 75 to stop supplying the electrical power supply line as a function of the return signal 74.

All the steps of the above monitoring method can be implemented equally well:

- by the execution of a set of program code instructions executed by a reprogrammable computing machine such as a PC type apparatus, a DSP (digital signal processor) or a microcontroller. This program code instructions can be stored in a non-transitory computer-readable carrier medium that is detachable (for example a floppy disk, a CD-ROM or a DVD-ROM) or non-detachable; or
- by a dedicated machine or component, such as an FPGA (Field Programmable Gate Array), an ASIC (Application-Specific Integrated Circuit) or any dedicated hardware component.

It should be noted that the invention is not limited to a purely software-based implementation, in the form of computer program instructions, but that it can also be implemented in hardware form or any form combining a hardware portion and a software portion.

Although the present disclosure has been described with reference to one or more examples, workers skilled in the art will recognize that changes may be made in form and detail without departing from the scope of the disclosure and/or the appended claims.

The exemplary embodiment here above described is applied to marine seismic exploration using seismic streamers. The invention of course is not limited to this particular field of application and can be applied to other field of application like marine seismic exploration using Ocean Bottom Cables (OBC) for seabed acquisition, for example.

An exemplary embodiment of the present disclosure provides a technique for monitoring an electrical power supply line comprised in a seismic cable that avoids the use of an electrical safety loop.

An exemplary embodiment of the present disclosure provides a technique of this kind that offers a seismic cable with a lightered and reduced size structure.

An exemplary embodiment of the present disclosure provides a technique of this kind that offers a cost-effective seismic cable.

An exemplary embodiment of the present disclosure provides a technique of this kind that relies solely on seismic cable architecture classically used.

Although the present disclosure has been described with reference to one or more examples, workers skilled in the art will recognize that changes may be made in form and detail without departing from the scope of the disclosure and/or the appended claims.

The invention claimed is:

1. A method for monitoring an electrical power supply line comprised in a seismic cable and extending along said seismic cable, said seismic cable further comprising:
   a plurality of seismic sensors arranged along the seismic cable,
   a plurality of controllers arranged along the seismic cable,
   an optical transmission line extending along said seismic cable for carrying data signals from or towards said controllers,
   said electrical power supply line supplying at least one pair of master and slave controllers,
   wherein the method comprises, for at least one given pair of master and slave controllers:
   the master controller monitoring a portion of said electrical power supply line comprised between said master and slave controllers, by using an optical loop established on a portion of said optical transmission line comprised between said master and slave controllers.

2. The method according to claim 1, wherein the master controller further performs:
   emitting an optical test signal through the portion of said optical transmission line comprised between said master and slave controllers,
   receiving an optical return signal supposed to result from a reflection of said test signal by the slave controller,
   said monitoring the portion of said electrical power supply line being performed as a function of said return signal.

3. The method according to claim 2, wherein the master controller further performs:
   determining an effective propagation duration elapsed between an emission instant of said optical test signal and a reception instant of said optical return signal;
   a first step of comparing the effective propagation duration with a first reference propagation duration which is as a function of a predetermined distance separating the master and slave controllers;
   obtaining a first piece of monitoring information as a function of the result of said first step of comparing.

4. The method according to claim 3, wherein said at least one given pair of master and slave controllers are separated by a cable portion comprising a plurality of cable sections, each cable section having an optical connector on both ends of said cable section,
   and wherein the master controller further performs, if the effective propagation duration is different from the first reference propagation duration:
   a second step of comparing the effective propagation duration with at least one second reference propagation duration, each being as a function of a predetermined distance separating said master controller and one of said optical connectors of the cable portion;
   obtaining a second piece of monitoring information as a function of the result of said second step of comparing.

5. The method according to claim 3, wherein the master controller further performs:
   processing said first piece of monitoring information and/or said second piece of monitoring information,
   delivering a positive or negative decision to stop supplying said slave controller via the portion of said electrical power supply line, as a function of the result of said step of processing.

6. The method according to claim 3, wherein the master controller further performs sending said first second piece of monitoring information and/or said second piece of monitoring information to a remote control system, accompanied with an identifier of said master controller, so as to take a positive or negative decision to stop supplying on said electrical power supply line.

7. A system for monitoring an electrical power supply line included in a seismic cable and extending along said seismic cable, said seismic cable further including:
- a plurality of seismic sensors arranged along the seismic cable,
- a plurality of controllers arranged along the seismic cable,
- an optical transmission line extending along said seismic cable for carrying data signals from or towards said controllers,
    - said electrical power supply line supplying in cascade a succession of pairs of master and slave controllers on a succession of portions of said electrical power supply line,
    - wherein the system comprises, for at least one given pair of master and slave controllers:
- optical means arranged to cooperate with a portion of said optical transmission line comprised between said master and slave controllers so as to form an optical loop starting from the master controller and passing through the slave controller, and
- means for monitoring, using said optical loop to monitor a portion of said electrical power supply line comprised between the master and slave controllers.

8. The system according to claim 7, wherein said optical means comprise:
- on the master controller side:
    - an optical source arranged for generating an optical test signal through the portion of said optical transmission line,
    - an optical sensor arranged for receiving an optical return signal supposed to result from a reflection of said optical test signal by light signal reflecting means comprised within the slave controller,
- on the slave controller side:
    - said light signal reflecting means arranged for reflecting said optical test signal coming from the master controller.

9. The system according to claim 8, wherein said means for monitoring comprise means for processing the optical return signal received by the optical sensor.

10. The system according to claim 8, wherein said light signal reflecting means comprise a device having a return loss coefficient which is upper than −15 dB.

11. The system according to claim 10, wherein said device belongs to the following group:
- an optical reflective mirror;
- a disconnected right-cleaved physical contact optical connector.

12. The system according to claim 7, wherein said at least one given pair of master and slave controllers are separated by a cable portion comprising a plurality of cable sections, each cable section comprising an optical connector on both ends of said cable section having a return loss coefficient which is upper than −15 dB when disconnected.

13. The system according to claim 12, wherein each optical connector is a right-cleaved physical contact optical connector.

14. The system according to claim 7, wherein the seismic cable belongs to the group comprising:
- a seismic streamer;
- an ocean bottom cable.

15. A non-transitory computer-readable carrier medium storing a computer program product comprising a computer program code instructions which, when executed on a computer or a processor, implement a method for monitoring an electrical power supply line comprised in a seismic cable and extending along said seismic cable, said seismic cable further comprising:
- a plurality of seismic sensors arranged along the seismic cable,
- a plurality of controllers arranged along the seismic cable,
- an optical transmission line extending along said seismic cable for carrying data signals from or towards said controllers,
    - said electrical power supply line supplying at least one pair of master and slave controllers,
    - wherein, for at least one given pair of master and slave controllers, the method comprises:
        - the master controller monitoring a portion of said electrical power supply line comprised between said master and slave controllers, by using an optical loop established on a portion of said optical transmission line comprised between said master and slave controllers.

* * * * *